United States Patent
Nishida

(10) Patent No.: US 8,878,617 B2
(45) Date of Patent: Nov. 4, 2014

(54) OPTICAL MODULE FOR ATOMIC OSCILLATOR AND ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 13/737,449

(22) Filed: Jan. 9, 2013

(65) Prior Publication Data

US 2013/0176080 A1 Jul. 11, 2013

(30) Foreign Application Priority Data

Jan. 11, 2012 (JP) ................................ 2012-003273

(51) Int. Cl.
| | | |
|---|---|---|
| H03B 17/00 | (2006.01) | |
| G04F 5/14 | (2006.01) | |
| H03L 7/26 | (2006.01) | |
| G21K 1/00 | (2006.01) | |
| H01S 5/0687 | (2006.01) | |
| G01R 33/44 | (2006.01) | |
| H01S 5/042 | (2006.01) | |

(52) U.S. Cl.
CPC *H03L 7/26* (2013.01); *G04F 5/145* (2013.01); *G21K 1/006* (2013.01); *H01S 5/0687* (2013.01); *G01R 33/44* (2013.01); *H01S 5/0427* (2013.01)
USPC ............................................. 331/94.1; 331/3

(58) Field of Classification Search
USPC ................................................... 331/94.1, 3
See application file for complete search history.

(56) References Cited

U.S. PATENT DOCUMENTS

| | | | |
|---|---|---|---|
| 5,387,881 A | | 2/1995 | Schweda et al. |
| 5,457,430 A | * | 10/1995 | English et al. ............... 331/94.1 |
| 2005/0062552 A1 | | 3/2005 | Deng et al. |
| 2006/0132130 A1 | | 6/2006 | Abbink et al. |
| 2007/0241097 A1 | * | 10/2007 | Shibata et al. ................. 219/492 |
| 2009/0302956 A1 | * | 12/2009 | Matsuura ..................... 331/94.1 |

FOREIGN PATENT DOCUMENTS

| | | |
|---|---|---|
| EP | 0 561 261 A1 | 9/1993 |
| JP | 2007-336136 | 12/2007 |
| JP | 2009-089116 | 4/2009 |
| JP | 2009-164331 | 7/2009 |
| JP | 2009-188598 | 8/2009 |

OTHER PUBLICATIONS

Extended European Search Report for Application No. EP 13 15 0616 dated Apr. 25, 2013 (6 pages).

* cited by examiner

*Primary Examiner* — Joseph Chang
*Assistant Examiner* — Jeffrey Shin
(74) *Attorney, Agent, or Firm* — Harness, Dickey & Pierce, P.L.C.

(57) ABSTRACT

An optical module for an atomic oscillator using a quantum interference effect includes a light source part to emit resonant light having two different wavelengths, a gas cell in which an alkali metal atom gas is enclosed and to which the resonant light is irradiated, a light detection part to detect an intensity of the resonant light transmitted through the gas cell, and a gas-flow generation part to generate a flow of the alkali metal atom gas.

12 Claims, 7 Drawing Sheets

OPTICAL MODULE FOR ATOMIC OSCILLATOR AND ATOMIC OSCILLATOR

BACKGROUND

1. Technical Field

The present invention relates to an optical module for an atomic oscillator and an atomic oscillator.

2. Related Art

In recent years, an atomic oscillator using CPT (Coherent Population Trapping) as one of quantum interference effects is proposed, and miniaturization of an apparatus and reduction in power consumption are expected. The atomic oscillator using the CPT is an oscillator using a phenomenon (EIT phenomenon: Electromagnetically Induced Transparency) in which when coherent light having two different kinds of wavelengths (frequencies) are irradiated to an alkali metal atom, absorption of the coherent light is stopped.

In the atomic oscillator, in general, the alkali metal atom such as rubidium or cesium is enclosed in a container (gas cell) made of silicon oxide or the like, and the coherent light is irradiated to the gas cell so that the EIT phenomenon occurs. In the gas cell, the alkali metal atom is gaseous (in the form of gas). In the atomic oscillator as stated above, in order to prevent the change of atomic density in the gas cell, control is performed so that the temperature of the gas cell becomes constant (see, for example, JP-A-2007-336136).

However, in the gas cell as stated above, the respective alkali metal atoms constituting the alkali metal atom gas move in random directions. Accordingly, the respective alkali metal atoms constituting the alkali metal atom gas have a distribution of velocity components in the same direction as the traveling direction of the coherent light. If the alkali metal atoms have the distribution of velocity components in the same direction as the traveling direction of the coherent light, a distribution of apparent wavelengths (frequencies) of the coherent light, that is, wavelengths (frequencies) of the coherent light when viewed from the alkali metal atom is generated by the light Doppler effect (Doppler shift). By this, the line width (light absorption width) of an obtained EIT signal becomes wide, and the frequency accuracy may be reduced.

SUMMARY

An advantage of some aspects of the invention is to provide an optical module for an atomic oscillator having high frequency accuracy. Another advantage of some aspects of the invention is to provide an atomic oscillator including the optical module for the atomic oscillator.

An aspect of the invention is directed to an optical module for an atomic oscillator using a quantum interference effect and including a light source part to emit resonant light having two different wavelengths, a gas cell in which an alkali metal atom gas is enclosed and to which the resonant light is irradiated, a light detection part to detect an intensity of the resonant light transmitted through the gas cell, and a gas-flow generation part to generate a flow of the alkali metal atom gas.

According to this optical module for the atomic oscillator, since the flow of the alkali metal atom gas is generated, as compared with the case where alkali metal atoms move in random directions, variation in velocity components of the alkali metal atoms in the same direction as the traveling direction of the resonant light can be reduced. By this, widening of the line width of an EIT signal due to the light Doppler effect (Doppler shift) can be suppressed. Accordingly, high frequency accuracy can be achieved.

In the optical module for the atomic oscillator, the gas-flow generation part may generate a temperature gradient in the gas cell.

According to this optical module for the atomic oscillator, the flow can be generated in the alkali metal atom gas by the simple structure.

In the optical module for the atomic oscillator, the gas-flow generation part may include a heater to supply heat to the gas cell.

According to this optical module for the atomic oscillator, the flow can be generated in the alkali metal atom gas by the simple structure.

In the optical module for the atomic oscillator, the gas-flow generation part may include a light-emitting part to emit light, and a light-absorbing part to absorb the light emitted from the light-emitting part and to generate heat.

According to this optical module for the atomic oscillator, the flow can be generated in the alkali metal atom gas by the simple structure.

In the optical module for the atomic oscillator, the gas-flow generation part may generate the flow in a direction parallel to a traveling direction of the resonant light in the alkali metal atom gas.

According to this optical module for the atomic oscillator, the occurrence efficiency of the EIT can be raised.

In the optical module for the atomic oscillator, the gas-flow generation part may generate the flow in a direction vertical to a traveling direction of the resonant light in the alkali metal atom gas.

According to this optical module for the atomic oscillator, since the flow is generated in the alkali metal atom gas, as compared with the case where the alkali metal atoms move in random directions, the variation in the velocity components of the alkali metal atoms in the same direction as the traveling direction of the resonant light can be reduced.

In the optical module for the atomic oscillator, the gas cell may be a rectangular parallelepiped, the gas-flow generation part may include a first heater provided on a first surface of the gas cell and a second heater provided on a second surface opposite to the first surface of the gas cell, and a temperature of the first heater at time of use may be higher than a temperature of the second heater at the time of use.

According to this optical module for the atomic oscillator, the flow can be generated in the alkali metal atom gas by the simple structure.

Another aspect of the invention is directed to an atomic oscillator including the optical module for the atomic oscillator.

According to this atomic oscillator, since the optical module for the atomic oscillator is included, high frequency accuracy is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to the drawings. Incidentally, the embodiments described below do not unduly limit the contents of the invention set forth in the appended claims. Besides, all structures described below are not necessarily inevitable components of the invention.

1. First Embodiment

Figure 1:
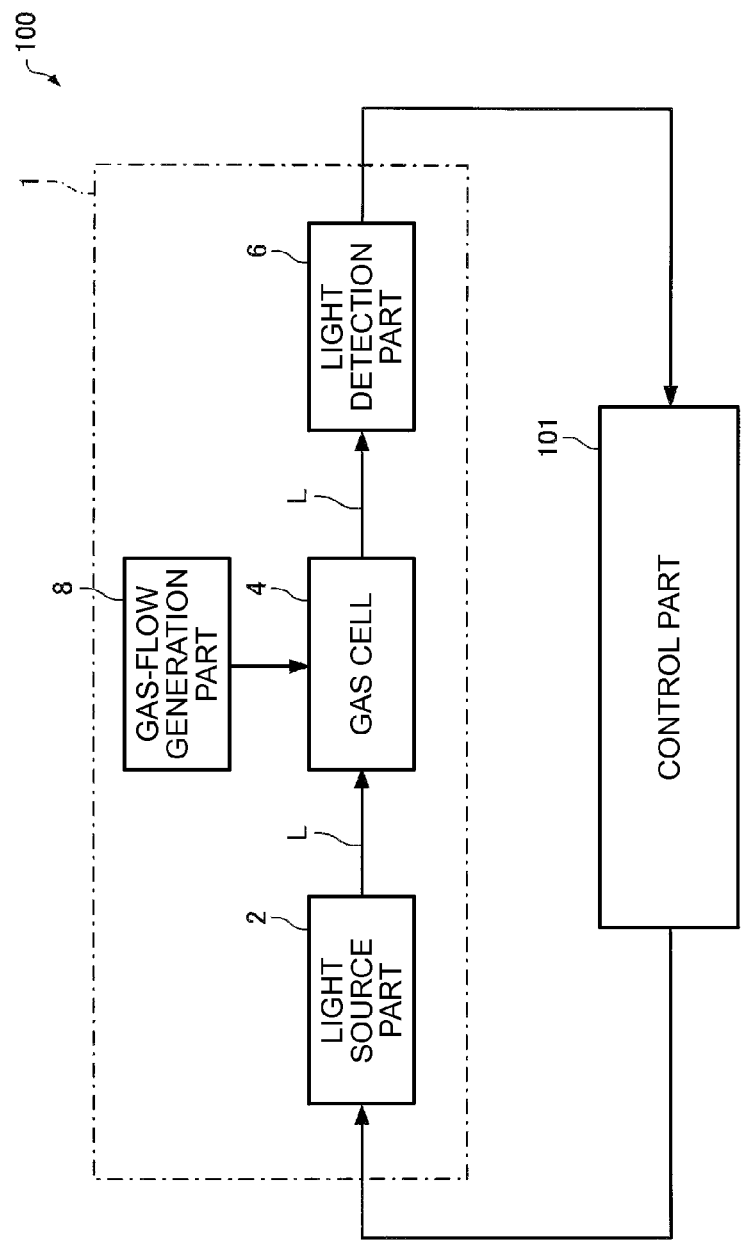
FIG. 1 is a functional block diagram of an atomic oscillator of a first embodiment.

First, an atomic oscillator of a first embodiment will be described with reference to the drawings. FIG. 1 is a functional block diagram of an atomic oscillator 100 of the first embodiment.

The atomic oscillator 100 is the oscillator using the quantum interference effect (EIT phenomenon). The atomic oscillator 100 includes an optical module 1 and a control part 101.

The optical module 1 includes a light source part 2, a gas cell 4, a light detection part 6 and a gas-flow generation part 8.

The light source part 2 emits resonant light L having two different wavelengths. The resonant light L generated in the light source part 2 includes a first sideband wave W1 having a frequency $f_1=f_0+f_m$ in an upper side band with respect to the center frequency $f_0$ and a second sideband wave W2 having a frequency $f_2=f_0-f_m$ in a lower side band with respect to the center frequency $f_0$ (see FIG. 2B).

The gas cell 4 is irradiated with the resonant light L. The gas cell 4 is such that gaseous alkali metal atoms (alkali metal atom gas) are enclosed in a container. As the alkali metal atom enclosed in the gas cell 4, a sodium (Na) atom, a rubidium (Rb) atom, a cesium (Cs) atom and the like are enumerated.

The light detection part 6 detects an intensity of the resonant light L transmitted through the gas cell 4.

The gas-flow generation part 8 generates a flow in the alkali metal atom gas. Here, to generate the flow in the alkali metal atom gas is to generate a movement in the alkali metal atom gas. That is, when all alkali metal atoms in the gas cell are considered, a specific tendency is generated in the movement of the alkali metal atoms. Since the gas-flow generation part 8 generates the flow in the alkali metal atom gas, as compared with the case where the alkali metal atoms move in random directions, variation in velocity components of the alkali metal atoms in the same direction as the traveling direction of the resonant light can be reduced. The reason will be described later.

Based on the detection result of the light detection part 6, the control part 101 controls so that a wavelength (frequency) difference between the first sideband wave W1 and the second sideband wave W2 becomes equal to a frequency corresponding to an energy difference between two ground levels of the alkali metal atom enclosed in the gas cell 4. The control part 101 generates a signal having the modulation frequency $f_m$ based on the detection result of the light detection part 6. The light source part 2 modulates a basic wave F having the specific frequency $f_0$ based on the signal having the modulation frequency $f_m$, and generates the first sideband wave W1 having the frequency $f_1=f_0+f_m$ and the second sideband wave W2 having the frequency $f_2=f_0-f_m$.

Figure 2A:
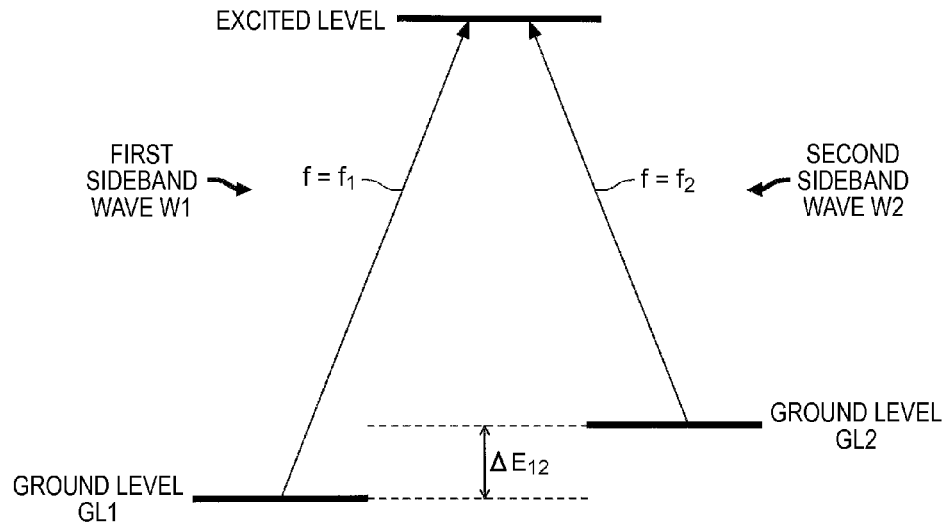
FIG. 2A is a view showing a Λ-type three-level model of an alkali metal atom, and a relation between the Λ-type three-level model, a first sideband wave, and a second sideband wave.
Figure 2B:
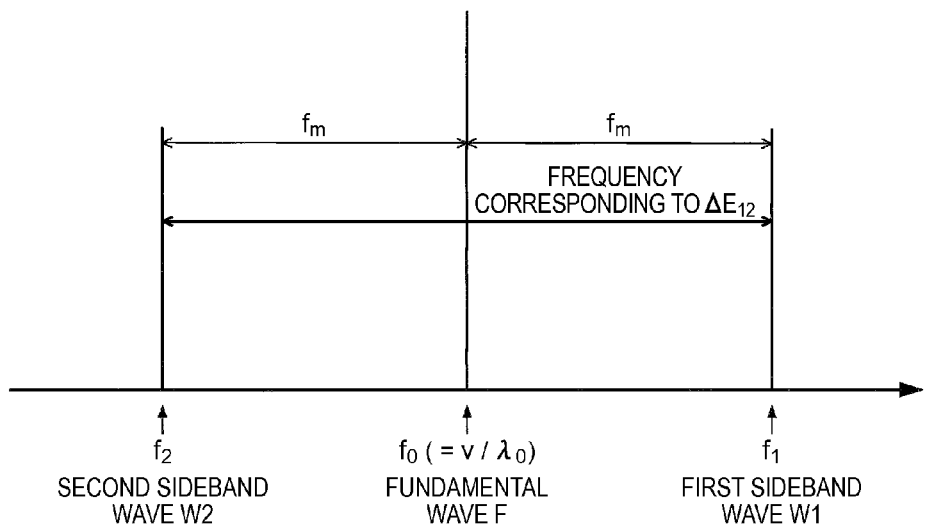
FIG. 2B is a view showing a frequency spectrum of resonant light generated in a light source part.

FIG. 2A is a view showing a Λ-type three-level model of the alkali metal atom and the relation between the Λ-type three-level model, the first sideband wave W1, and the second sideband wave W2. FIG. 2B is a view showing a frequency spectrum of the resonant light.

As shown in FIG. 2B, the resonant light L generated in the light source part 2 includes the basic wave F having the center frequency $f_0$ ($=v/\lambda_0$: v is the speed of light, $\lambda_0$ is the center wavelength of the laser light), the first sideband wave W1 having the frequency $f_1$ in the upper side band with respect to the center frequency $f_0$, and the second sideband wave W2 having the frequency $f_2$ in the lower side band with respect to the center frequency $f_0$. The frequency $f_1$ of the first sideband wave W1 is $f_1=f_0+f_m$, and the frequency $f_2$ of the second sideband wave W2 is $f_2=f_0-f_m$.

As shown in FIGS. 2A and 2B, the frequency difference between the frequency $f_1$ of the first sideband wave W1 and the frequency $f_2$ of the second sideband wave W2 coincides with the frequency corresponding to the energy difference $\Delta E_{12}$ between the ground level GL1 and the ground level GL2 of the alkali metal atom. Accordingly, the alkali metal atom causes the EIT phenomenon by the first sideband wave W1 having the frequency $f_1$ and the second sideband wave $W_2$ having the frequency $f_2$.

Here, the EIT phenomenon will be described. It is known that the interaction between the alkali metal atom and light can be explained by the Λ-type three-level system model. As shown in FIG. 2A, the alkali metal atom has the two ground levels, and when the first sideband wave W1 having the wavelength (frequency $f_1$) corresponding to the energy difference between the ground level GL1 and the excited level or the second sideband wave W2 having the wavelength (frequency $f_2$) corresponding to the energy difference between the ground level GL2 and the excited level are individually irradiated to the alkali metal atom, light absorption occurs. However, as shown in FIG. 2B, when the first sideband wave W1 and the second sideband wave W2 in which the frequency difference $f_1-f_2$ accurately coincides with the frequency corresponding to the energy difference $\Delta E_{12}$ between the ground level GL1 and the ground level GL2 are simultaneously irradiated to the alkali metal atom, a superimposed state of the two ground levels, that is, a quantum interference state occurs, the excitation to the excited level is stopped, and the transparency phenomenon (EIT phenomenon) occurs in which the first sideband wave W1 and the second sideband wave W2 pass through the alkali metal atom. A highly accurate oscillator can be formed by using the EIT phenomenon and by detecting and controlling the abrupt change of the light absorption behavior when the frequency difference $f_1-f_2$ between the first sideband wave W1 and the second sideband wave W2 is shifted from the frequency corresponding to the energy difference $\Delta E_{12}$ between the ground level GL1 and the ground level GL2.

Hereinafter, a more specific structure of the atomic oscillator of the first embodiment will be described.

Figure 3:
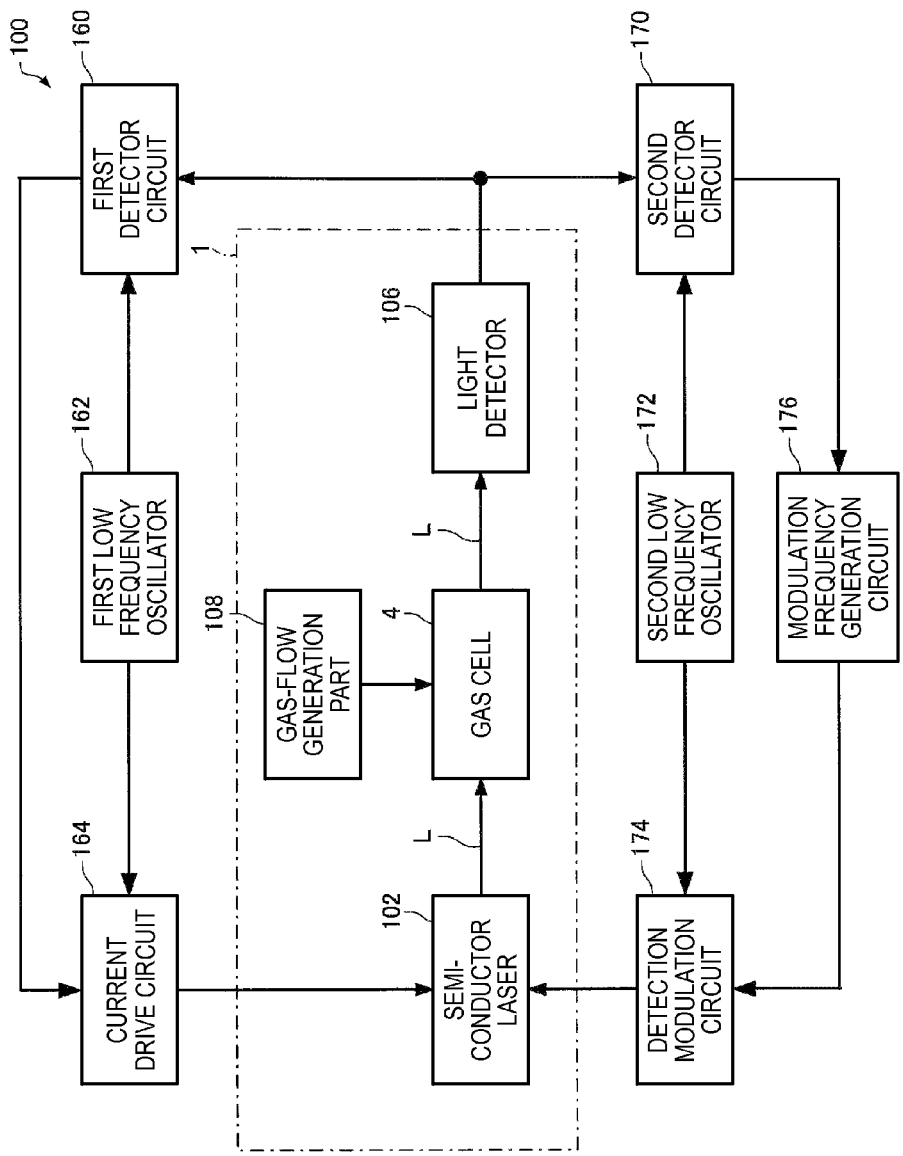
FIG. 3 is a view showing a structure of the atomic oscillator of the first embodiment.

FIG. 3 is a view showing the atomic oscillator 100 of the first embodiment.

As shown in FIG. 3, the atomic oscillator 100 includes a semiconductor laser 102, a gas cell 4, a light detector 106, a gas-flow generation part 108, a first detector circuit 160, a first low frequency oscillator 162, a current drive circuit 164, a second detector circuit 170, a second low frequency oscillator 172, a detection modulation circuit 174, and a modulation frequency generation circuit 176.

The semiconductor laser 102 can irradiate the resonant light L to the alkali metal atom contained in the gas cell 4. The center frequency $f_0$ (center wavelength $\lambda_0$) of the laser light emitted by the semiconductor laser 102 is controlled by the drive current outputted by the current drive circuit 164, and the laser light is modulated by the output signal (modulation signal) of the modulation frequency generation circuit 176. That is, an AC current having the frequency component of the modulation signal is superimposed on the drive current of the current drive circuit 164, so that the laser light emitted by the semiconductor laser 102 can be modulated. By this, the semiconductor laser 102 can emit the resonant light L including the first sideband wave W1 and the second sideband wave W2.

The semiconductor laser 102 is, for example, a surface emitting semiconductor laser (VCSEL). Since the light generated in the surface emitting semiconductor laser is coherent, the light is preferable for obtaining the quantum interference effect. Incidentally, the semiconductor laser 102 may be an end-face emitting laser.

The gas cell 4 is such that gaseous alkali metal atoms (alkali metal atom gas) are enclosed in a container. When two light waves having a frequency (wavelength) difference corresponding to the energy difference between the two ground levels of the alkali metal atom are irradiated to the gas cell 4, the alkali metal atom causes the EIT phenomenon. For example, if the alkali metal atom is a cesium atom, since the frequency corresponding to the energy difference between the ground level GL1 and the ground level GL2 in the D1 line is 9.19263●●● GHz, when two light waves having the frequency difference of 9.1926●●● GHz are irradiated, the EIT phenomenon occurs.

The light detector 106 detects the resonant light L transmitted through the gas cell 4, and outputs a signal having a signal intensity corresponding to the amount of the detected light. The light detector 106 is, for example, a photodiode.

The gas-flow generation part 108 supplies heat to the gas cell 4, and generates a temperature gradient in the gas cell 4. By this, a flow is generated in the alkali metal atom gas in the gas cell 4 by convection.

The first detector circuit 160 uses the oscillation signal of the first low frequency oscillator 162 oscillating at a low frequency of several Hz to several hundred Hz and synchronously detects the output signal of the light detector 106.

The current drive circuit 164 generates the drive current having a magnitude corresponding to the output signal of the first detector circuit 160, and controls the center frequency $f_0$ (center wavelength $\lambda_0$) of the laser light. Incidentally, in order to enable the synchronous detection by the first detector circuit 160, the oscillation signal (equal to the oscillation signal supplied to the first detector circuit 160) of the first low frequency oscillator 162 is superimposed on the drive current generated by the current drive circuit 164.

The center frequency $f_0$ (center wavelength $\lambda_0$) of the laser light is finely adjusted and stabilized by a feedback loop passing through the semiconductor laser 102, the gas cell 4, the light detector 106, the first detector circuit 160 and the current drive circuit 164.

The second detector circuit 170 uses the oscillation signal of the second low frequency oscillator 172 oscillating at a low frequency of several Hz to several hundred Hz and synchronously detects the output signal of the light detector 106.

The modulation frequency generation circuit 176 generates the modulation signal having the modulation frequency $f_m$ corresponding to the voltage of the output signal of the second detector circuit 170.

The modulation signal is modulated by the detection modulation circuit 174 and by the oscillation signal (equal to the oscillation signal supplied to the second detector circuit 170) of the second low frequency oscillator 172, and is supplied to the semiconductor laser 102. By this, while the modulation frequency $f_m$ is slightly swept, the synchronous detection is performed by the second detector circuit 170, and the modulation frequency $f_m$ is finely adjusted so that the output signal of the light detector 106 becomes maximum.

In the atomic oscillator 100, unless the frequency difference between the first sideband wave W1 and the second sideband wave W2 of the resonant light L accurately coincides with the frequency corresponding to the energy difference between the two ground levels of the alkali metal atom included in the gas cell 4, the alkali metal atom does not cause the EIT phenomenon. Thus, the detection amount of the light detector 106 is very sensitively changed according to the frequencies of the first sideband wave W1 and the second sideband wave W2. Accordingly, the feedback control is performed by the feedback loop passing through the semiconductor laser 102, the gas cell 4, the light detector 106, the second detector circuit 170, the modulation frequency generation circuit 176 and the detection modulation circuit 174, so that the frequency difference between the first sideband wave W1 and the second sideband wave W2 of the resonant light L very accurately coincides with the frequency corresponding to the energy difference between the two ground levels of the alkali metal atom. As a result, the modulation frequency becomes a very stable frequency, and therefore, the modulation signal can be made the output signal (clock output) of the atomic oscillator 100.

Here, the structure of the optical module 1 will be described more specifically.

Figure 4:
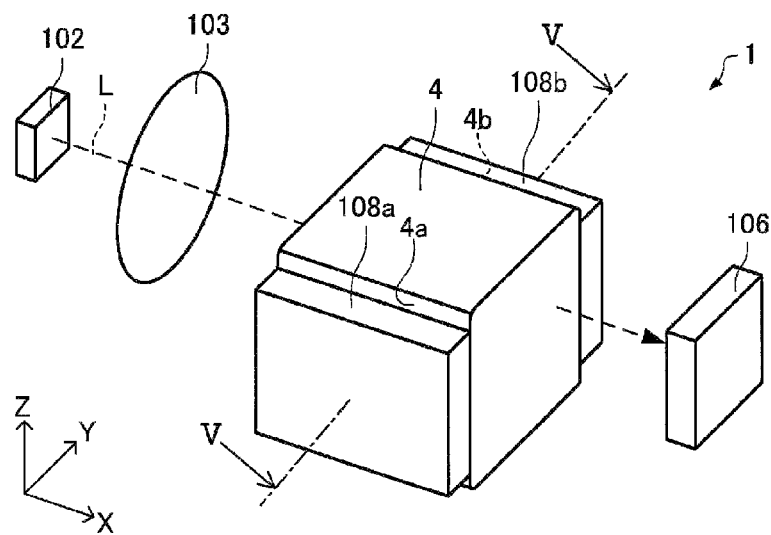
FIG. 4 is a perspective view schematically showing an optical module of the atomic oscillator of the first embodiment.
Figure 5:
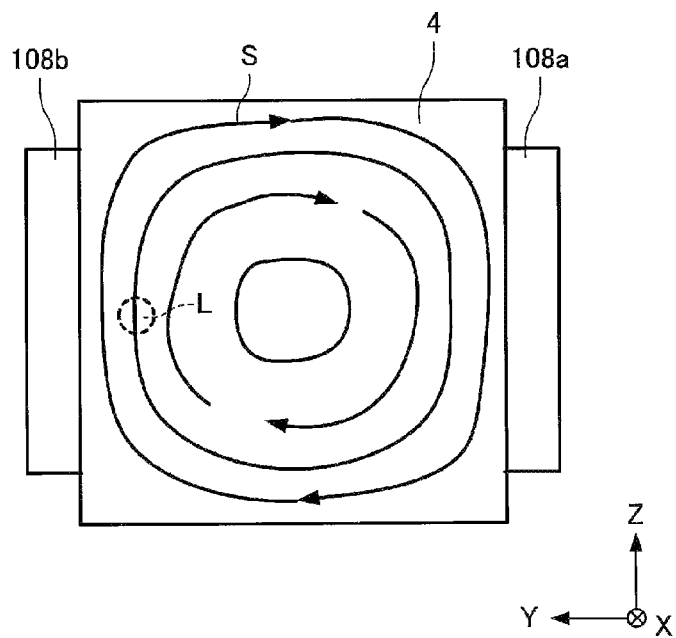
FIG. 5 is a sectional view schematically showing the optical module of the atomic oscillator of the first embodiment.

FIG. 4 is a perspective view schematically showing the optical module 1. FIG. 5 is a sectional view schematically showing the optical module 1. Incidentally, FIG. 5 is a V-V line sectional view of FIG. 4. In FIG. 4 and FIG. 5, for convenience, an X-axis, a Y-axis and a Z-axis orthogonal to each other are shown.

In the optical module 1, as shown in FIG. 4, the semiconductor laser 102, a collimate lens 103, the gas cell 4 and the light detector 106 are arranged along the X-axis.

The resonant light L emitted from the semiconductor laser 102 travels along the X-axis. That is, here, the optical axis of the resonant light L is parallel to the X-axis, and the traveling direction (optical axis direction) of the resonant light L is the X direction.

The optical module 1 may include the collimate lens 103 for converting the resonant light L into parallel light between the semiconductor laser 102 and the gas cell 4.

The resonant light L emitted from the semiconductor laser 102 is incident on the gas cell 4 through the collimate lens 103. The semiconductor laser 102 irradiates the resonant light L to a portion except the center of the gas cell 4. In the illustrated example, the gas cell 4 is a rectangular parallelepiped, and the resonant light L is irradiated to a portion except the center (center of the rectangular parallelepiped) of the gas cell 4 and passes through a position shifted to a second heater 108b side (+Y direction) from the center of the gas cell 4. This is because, since a flow S of the alkali metal atom gas is low in the vicinity of the center of the gas cell 4, as compared with the vicinity of the outside of the gas cell 4, variation in velocity components of the alkali metal atoms in the X direction (traveling direction) is large.

The gas cell 4 is the rectangular parallelepiped in the illustrated example. The shape of the gas cell 4 is not limited to the rectangular parallelepiped, and may be another polyhedron, a cylinder or a sphere.

The gas-flow generation part 108 includes a first heater 108a and the second heater 108b. The first heater 108a is provided on a first side surface (first surface) 4a of the gas cell 4. The second heater 108b is provided on a second side surface (second surface) 4b opposite to the first side surface 4a. The first side surface 4a and the second side surface 4b are surfaces not intersecting the optical axis of the resonant light L (that is, surfaces on which the resonant light L is not incident), and are, in this embodiment, surfaces having perpendicular lines that are parallel to the Y-axis. The first heater 108a and the second heater 108b can supply heat to the gas cell 4.

The gas-flow generation part 108 includes, for example, a control part (not shown) for controlling the first heater 108a and the second heater 108b. The control part controls such that for example, the temperature of the first heater 108a becomes higher than the temperature of the second heater 108b. By this, a temperature gradient occurs in the gas cell 4, and the constant flow S is generated in the alkali metal atom gas by convection.

In the example shown in FIG. 5, the flow S circulating clockwise when viewed in the traveling direction (X direction) of the resonant light L is generated in the alkali metal atom gas. Accordingly, in the area where the resonant light L is irradiated, the flow S of the alkali metal atom gas is generated from the lower side of the gas cell 4 to the upper side. That is, in the area where the resonant light L is irradiated, the flow S of the alkali metal atom gas is generated in the direction (Z direction) perpendicular to the traveling direction (X direction) of the resonant light L.

Figure 6A:
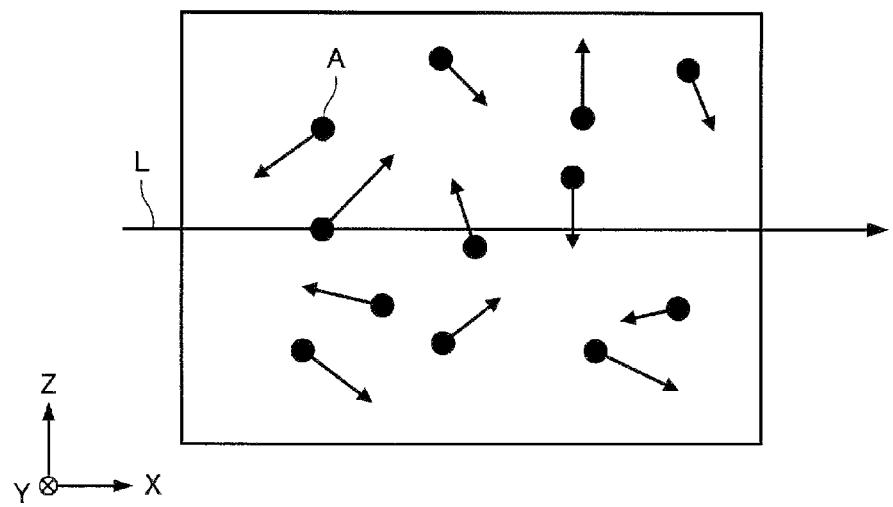
FIG. 6A is a view schematically showing the inside of a gas cell when alkali metal atoms move randomly.
Figure 6B:
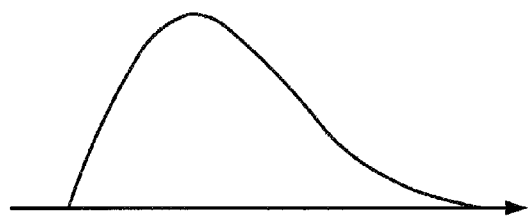
FIG. 6B is a graph showing a distribution of velocity components of the alkali metal atoms in an X-direction when the alkali metal atoms move randomly.
Figure 7A:
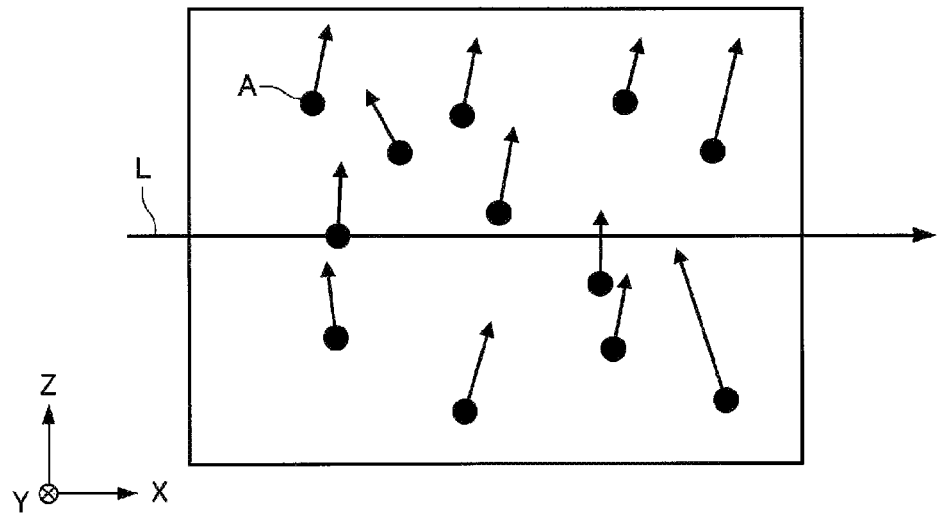
FIG. 7A is a view schematically showing the inside of the gas cell when flow is generated in an alkali metal atom gas.
Figure 7B:
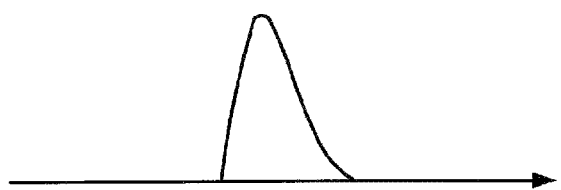
FIG. 7B is a graph showing a distribution of velocity components of the alkali metal atoms in the X-direction when the flow is generated in the alkali metal atom gas.

FIG. 6A is a view schematically showing the inside of the gas cell when the alkali metal atoms move randomly. FIG. 6B is a graph showing a distribution of velocity components of the alkali metal atoms in the X direction when the alkali metal atoms move randomly. FIG. 7A is a view schematically showing the inside of the gas cell when the flow is generated in the alkali metal atom gas. FIG. 7B is a graph showing a distribution of velocity components of the alkali metal atoms in the X direction when the flow is generated in the alkali metal atom gas. The horizontal axis of FIG. 6B and FIG. 7B expresses the velocity of the alkali metal atom in the X direction. Incidentally, the X direction is the traveling direction of the resonant light L.

As shown in FIGS. 6A and 6B, in the gas cell, when the alkali metal atoms move randomly (when a flow is not generated in the alkali metal atom gas), variation in the velocity components of the alkali metal atoms in the X direction is large. On the other hand, as shown in FIGS. 7A and 7B, when the flow in the Z direction is generated in the gas cell, variation in the velocity components of the alkali metal atoms in the X direction is small as compared with the case where the alkali metal atoms move randomly.

Incidentally, in the example of FIGS. 7A and 7B, although the flow in the Z direction is generated in the alkali metal atom gas, also when the flow in another direction (for example, the X direction or the Y direction) is generated in the alkali metal atom gas, the variation in the velocity components of the alkali metal atoms in the X direction becomes small as compared with the case where the alkali metal atoms move randomly.

As stated above, the flow is generated in the alkali metal atom gas, so that the variation in the magnitude of the velocity components of the alkali metal atoms in the X direction (traveling direction of the resonant light L) can be reduced as compared with the case where the alkali metal atoms move randomly. The variation in the velocity components of the alkali metal atoms in the X direction (traveling direction of the resonant light L) is reduced, so that broadening of the line width (light absorption width, range of frequency difference in which the EIT phenomenon occurs) due to the light Doppler effect (Doppler shift) can be suppressed. That is, reduction in frequency accuracy can be suppressed. Accordingly, reduction in frequency accuracy can be suppressed by generating the flow in the alkali metal atom gas.

Incidentally, the semiconductor laser 102, the light detector 106 and the gas-flow generation part 108 respectively correspond to the light source part 2, the light detection part 6 and the gas-flow generation part 8 shown in FIG. 1. Besides, a circuit including the first detector circuit 160, the first low frequency oscillator 162, the current drive circuit 164, the second detector circuit 170, the second low frequency oscillator 172, the detection modulation circuit 174 and the modulation frequency generation circuit 176 corresponds to the control part 101 shown in FIG. 1.

The optical module 1 of the embodiment and the atomic oscillator 100 have, for example, following features.

According to the optical module 1, as described above, the gas-flow generation part 108 generates the flow in the alkali metal atom gas, so that the reduction in frequency accuracy due to the light Doppler effect can be suppressed. Accordingly, the optical module 1 can have high frequency accuracy.

According to the optical module 1, the gas-flow generation part 108 generates the temperature gradient in the gas cell 4, so that the flow S can be generated in the alkali metal atom. gas. By this, for example, as described above, the flow can be generated in the alkali metal atom gas by the simple structure using the heaters 108a and 108b and the like. Accordingly, the apparatus can be simplified. Further, the convection is generated in the alkali metal atom gas, so that the flow S of the alkali metal atom gas can be made constant. By this, the variation in the magnitude of the velocity components of the alkali metal atoms in the X direction (traveling direction of the resonant light L) can be further reduced.

The atomic oscillator 100 of the embodiment includes the optical module 1, and can have high frequency accuracy.

Incidentally, in the embodiment, although the gas-flow generation part 108 uses the two heaters 108a and 108b and generates the flow in the alkali metal atom gas, the number of the heaters is not particularly limited as long as the flow can be generated in the alkali metal atom gas.

2. Second Embodiment

Figure 8:
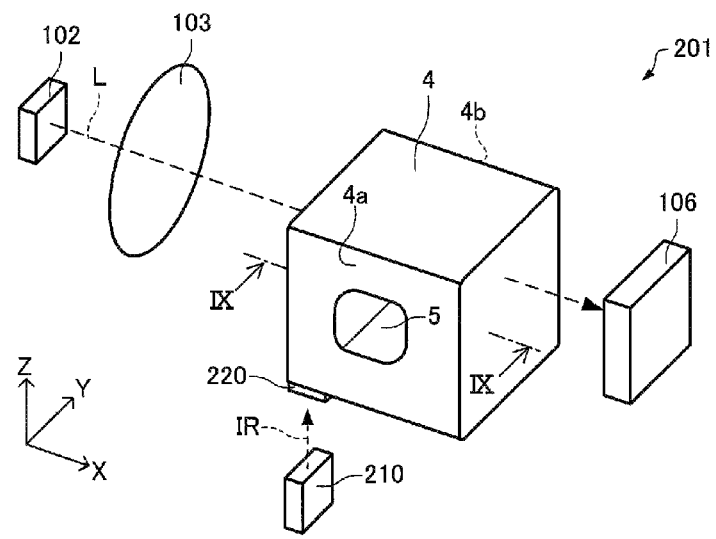
FIG. 8 is a perspective view schematically showing an optical module of an atomic oscillator of a second embodiment.
Figure 9:
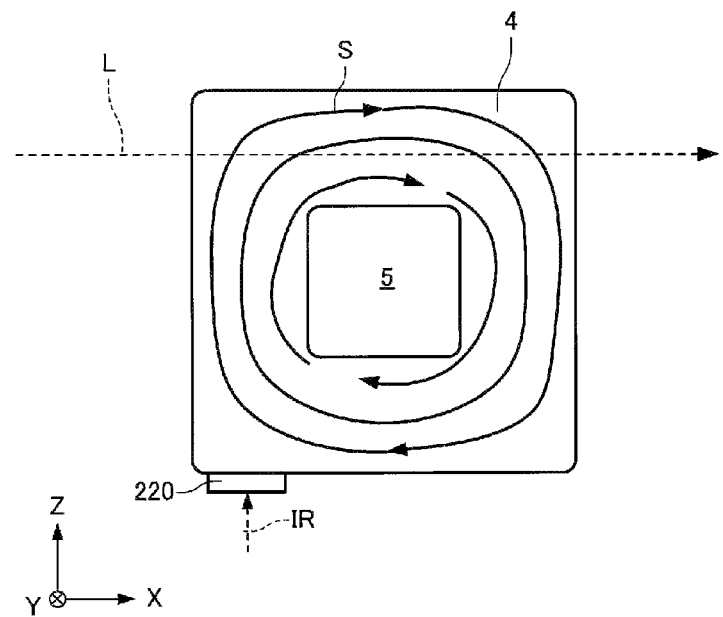
FIG. 9 is a sectional view schematically showing the optical module of the atomic oscillator of the second embodiment.

Next, an atomic oscillator of a second embodiment will be described with reference to the drawings. FIG. 8 is a perspective view schematically showing an optical module 201 of the atomic oscillator of the second embodiment. FIG. 9 is a sectional view schematically showing the optical module 201. Incidentally, FIG. 9 is a IX-IX line sectional view of FIG. 8. Hereinafter, in the optical module 201 of the second embodiment, a component having the same function as the component of the optical module 1 of the first embodiment is denoted by the same reference numeral and its detailed description is omitted.

In the optical module 201, as shown in FIG. 8 and FIG. 9, a gas-flow generation part 108 includes a light-emitting part 210 and a light-absorbing part 220 to absorb light emitted from the light-emitting part 210.

The light-emitting part 210 can supply heat by irradiating a gas cell 4 with the light. The light-emitting part 210 emits, for example, infrared ray IR, and the light-absorbing part 220 is formed of a material capable of absorbing the infrared ray IR. The infrared ray IR emitted from the light-emitting part 210 is irradiated to the light-absorbing part 220. As the light-emitting part 210, for example, a light emitting device such as an infrared lamp or a semiconductor laser can be used.

The light-absorbing part 220 absorbs the infrared ray IR emitted from the light-emitting part 210 and generates heat. By this, the heat can be supplied to the gas cell 4. The light-absorbing part 220 is provided on the lower surface of the gas cell 4 in the illustrated example. The gas cell 4 is provided with a through-hole 5 passing through from a first side surface 4a to a second side surface 4b. Thus, a flow S circulating around the through-hole 5 can be generated in the alkali metal atom gas by supplying the heat from the lower surface side of the gas cell 4 by the light-absorbing part 220.

In the example shown in FIG. 9, the flow S circulating clockwise when viewed in the direction (Y direction) perpendicular to the traveling direction (X direction) of the resonant light L is generated in the alkali metal atom gas. The resonant light L passes through a portion above the through-hole 5 (+Z direction side with respect to the through-hole 5). Thus, in the area where the resonant light L is irradiated, the flow S of the alkali metal atom is generated in the direction parallel to the traveling direction (X direction) of the resonant light L. Accordingly, as compared with the case where the alkali metal atoms move in random directions, variation in velocity components of alkali metal atoms in the X direction (traveling direction of the resonant light L) can be reduced. Further, since the traveling direction of the resonant light L is equal to the direction of the flow S of the alkali metal atom gas, the occurrence efficiency of the EIT can be raised as compared with the case where the traveling direction of the resonant light L is different from the direction of the flow S of the alkali metal atom gas. This is because, when the traveling direction of the resonant light L is equal to the direction of the flow S of the alkali metal atom gas, as compared with the case where the traveling direction of the resonant light L is different from the direction of the flow S of the alkali metal atom gas, interaction time between the alkali metal atom and the resonant light L becomes long.

Incidentally, the other structure of the atomic oscillator of this embodiment is the same as the foregoing atomic oscillator 100 and the description thereof is omitted.

The optical module of the embodiment has, for example, following features.

According to the optical module 201 of the embodiment, similarly to the optical module 1 of the first embodiment, the gas-flow generation part 108 generates the flow in the alkali metal atom gas, so that reduction in frequency accuracy due to the light Doppler effect can be suppressed. Accordingly, the optical module 201 can have high frequency accuracy.

According to the optical module 201, the gas-flow generation part 108 generates the temperature gradient in the gas cell, and can generate the flow in the alkali metal atom gas. By this, for example, as described above, the flow can be generated in the alkali metal atom gas by the simple structure using the light-emitting part 210, the light-absorbing part 220 and the like. Accordingly, the apparatus can be simplified.

According to the optical module 201 of the embodiment, since the traveling direction of the resonant light L is equal to the direction of the flow S of the alkali metal atom gas, as compared with the case where the traveling direction of the resonant light L is different from the direction of the flow S of the alkali metal atom gas, the occurrence efficiency of the EIT can be raised.

Incidentally, the invention is not limited to the foregoing embodiments, and can be variously modified within the scope of the spirit of the invention.

For example, in the first embodiment, as shown in FIG. 5, the description is made on the case where, in the area where the resonant light L is irradiated, the flow S of the alkali metal atom gas is generated in the direction (Z direction) perpendicular to the traveling direction (X direction) of the resonant light L. Besides, in the second embodiment, as shown in FIG. 9, the description is made on the case where, in the area where the resonant light L is irradiated, the flow S of the alkali metal atom gas is generated in the same direction as the traveling direction (X direction) of the resonant light L. However, the direction of the flow S of the alkali metal atom gas in the area where the resonant light L is irradiated is not particularly limited. Even if the direction of the flow S of the alkali metal atom gas is any direction with respect to the traveling direction of the resonant light L, as described above, the variation in the velocity components of the alkali metal atoms in the X direction becomes small as compared with the case where the alkali metal atoms move in random directions. Accordingly, in the area where the resonant light L is irradiated, if the flow S is generated in the alkali metal atom gas, the frequency accuracy of the atomic oscillator can be improved irrespective of the direction of the flow S.

Besides, for example, in the first embodiment, as shown in FIG. 4, the gas-flow generation part 108 includes the heaters 108a and 108b. In the second embodiment, as shown in FIG. 8, the gas-flow generation part includes the light-emitting part 210 and the light-absorbing part 220. However, the structure of the gas-flow generation part is not limited to these. The structure of the gas-flow generation part is not particularly limited as long as the flow can be generated in the alkali metal atom gas in the gas cell.

The invention includes substantially the same structure as the structure described in the embodiments (for example, a structure having the same function, method and result, or a structure having the same object and effect). Besides, the invention includes a structure in which an unessential portion of the structure described in the embodiments is replaced. Besides, the invention includes a structure in which the same operation and effect as those of the structure described in the embodiments can be obtained or a structure in which the same object can be achieved. Besides, the invention includes a structure in which a well-known technique is added to the structure described in the embodiments.

The entire disclosure of Japanese Patent Application No. 2012-003273, filed Jan. 11, 2012, is expressly incorporated by reference herein.

What is claimed is:

1. An optical module for an atomic oscillator using a quantum interference effect, comprising:
   a light source part to emit resonant light having two different wavelengths;
   a gas cell in which an alkali metal atom gas is enclosed and to which the resonant light is irradiated;
   a light detection part to detect an intensity of the resonant light transmitted through the gas cell; and a gas-flow generation part to generate a flow of the alkali metal atom gas, wherein the gas cell has a first surface and a second surface opposite to the first surface, the gas-flow generation part includes first and second heaters, the first heater is provided on the first surface of the gas cell, and the second heater is provided on the second of the gas cell, and an operating temperature of the first heater is higher than an operating temperature of the second heater.

2. The optical module for the atomic oscillator according to claim 1, wherein the gas cell is a rectangular parallelepiped.

3. The optical module for the atomic oscillator according to claim 2, wherein the gas-flow generation part generates the flow in a direction perpendicular to a traveling direction of the resonant light in the alkali metal atom gas.

4. An atomic oscillator comprising the optical module for the atomic oscillator according to claim 3.

5. The optical module for the atomic oscillator according to claim 2, wherein the gas-flow generation part generates the flow in a direction parallel to a traveling direction of the resonant light in the alkali metal atom gas.

6. An atomic oscillator comprising the optical module for the atomic oscillator according to claim 5.

7. An atomic oscillator comprising the optical module for the atomic oscillator according to claim 2.

8. The optical module for the atomic oscillator according to claim 1, wherein the gas-flow generation part generates the flow in a direction parallel to a traveling direction of the resonant light in the alkali metal atom gas.

9. An atomic oscillator comprising the optical module for the atomic oscillator according to claim 8.

10. The optical module for the atomic oscillator according to claim 1, wherein the gas-flow generation part generates the flow in a direction perpendicular to a traveling direction of the resonant light in the alkali metal atom gas.

11. An atomic oscillator comprising the optical module for the atomic oscillator according to claim 10.

12. An atomic oscillator comprising the optical module for the atomic oscillator according to claim 1.

* * * * *